United States Patent
Carpenter et al.

(10) Patent No.: US 8,802,508 B2
(45) Date of Patent: Aug. 12, 2014

(54) SEMICONDUCTOR DEVICE PACKAGE

(71) Applicants: Burton J. Carpenter, Austin, TX (US); Boon Yew Low, Petaling Jaya (MY); Shufeng Zhao, Tianjin (CN)

(72) Inventors: Burton J. Carpenter, Austin, TX (US); Boon Yew Low, Petaling Jaya (MY); Shufeng Zhao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 1 day.

(21) Appl. No.: 13/689,034

(22) Filed: Nov. 29, 2012

(65) Prior Publication Data
US 2014/0147975 A1 May 29, 2014

(51) Int. Cl.
*H01L 21/82* (2006.01)
*H01L 21/56* (2006.01)

(52) U.S. Cl.
CPC ..................................... *H01L 21/56* (2013.01)
USPC ........... 438/127; 438/106; 438/107; 438/110; 438/112; 257/667; 257/676; 257/678; 257/687; 257/693

(58) Field of Classification Search
None
See application file for complete search history.

(56) References Cited

U.S. PATENT DOCUMENTS

| | | | |
|---|---|---|---|
| 5,012,386 A | 4/1991 | McShane et al. | |
| 5,216,283 A | 6/1993 | Lin | |
| 5,977,626 A | 11/1999 | Wang et al. | |
| 6,146,921 A * | 11/2000 | Barrow | 438/122 |
| 6,507,116 B1 | 1/2003 | Caletka et al. | |
| 7,095,123 B2 | 8/2006 | Prior | |
| 2009/0236618 A1 | 9/2009 | Yasuda | |

* cited by examiner

*Primary Examiner* — Kyoung Lee
(74) *Attorney, Agent, or Firm* — Mary Jo Bertani; Joanna G. Chiu

(57) ABSTRACT

Forming a packaged semiconductor device includes placing a semiconductor die attached to a carrier into a mold cavity having an injection port, wherein the semiconductor die has an encapsulant exclusion region on a top surface of the semiconductor die within an outer perimeter of the top surface; and flowing an encapsulant over the semiconductor die and carrier from the injection port, wherein the encapsulant flows around the encapsulant exclusion region to surround the encapsulant exclusion region without covering the encapsulant exclusion region. The encapsulant exclusion region has a first length corresponding to a single longest distance across the encapsulant exclusion region, wherein the first length is aligned, within 30 degrees, to a line defined by a shortest distance between an entry point of the injection port into the mold cavity and an outer perimeter of the encapsulant exclusion region.

21 Claims, 2 Drawing Sheets

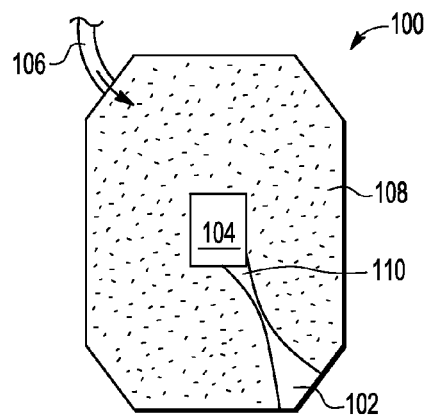
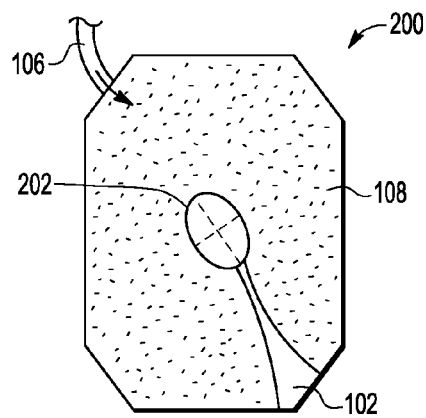
FIG. 1
- PRIOR ART -
FIG. 2
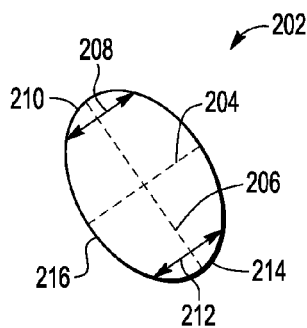
FIG. 3
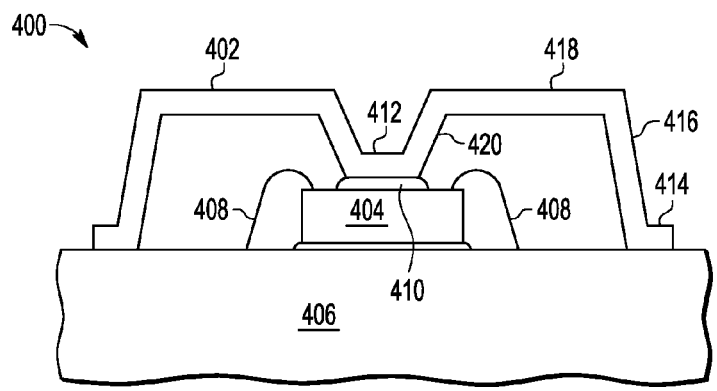
FIG. 4

SEMICONDUCTOR DEVICE PACKAGE

BACKGROUND

1. Field

This disclosure relates generally to semiconductor devices, and more specifically, to semiconductor device packages with heat spreaders.

2. Related Art

Some types of packaged semiconductor devices include an integrated circuit die mounted on a substrate. Wirebonds are formed between the die and the substrate to form a die assembly that connects the die to bond pads on the substrate. Mold encapsulant is formed around the die and the wirebonds to protect the die from corrosion, water, and external forces that may damage the die or break the wire bonds. A heat spreader can be positioned over the die to conduct heat away from the die during operation. An encapsulant exclusion region may be formed in the encapsulant over the die to allow the heat spreader to be attached to the top of the die with a thermally conductive interface material.

In some cases, the encapsulant exclusion region is formed during a film assisted molding process in which the package substrate and wirebonded die are placed between top and bottom molds. The molds enclose the die assembly and a pedestal is included in the mold facing the top of the die. Mold encapsulant is injected into the mold and forms around the die assembly. The pedestal prevents the encapsulant from covering the top of the die. A heat spreader can be attached to the top of the die after the die assembly is released from the mold.

In other cases, the heat spreader can include a pedestal or downset over the top of the die. The mold encapsulant can be injected between the heat spreader and the die assembly after the downset of the heat spreader is attached to the top of the die.

In either case, it is desirable to avoid void areas in the encapsulant around the die and wirebonds since moisture or other corrosive substances could enter the voids and reduce the reliability of the die assembly.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 1 is a top view of a packaged semiconductor device with a void forming as the mold encapsulant is injected around an encapsulant exclusion region.

FIG. 2 is a top view of an embodiment of a packaged semiconductor device with encapsulant exclusion region shaped to reduce the potential for void areas in the encapsulant.

FIG. 3 is a top view of the encapsulant exclusion region of FIG. 2.

FIG. 4 is side cross-sectional view along a minor axis of the encapsulant exclusion region of the packaged semiconductor device of FIG. 2.

DETAILED DESCRIPTION

Figure 5:
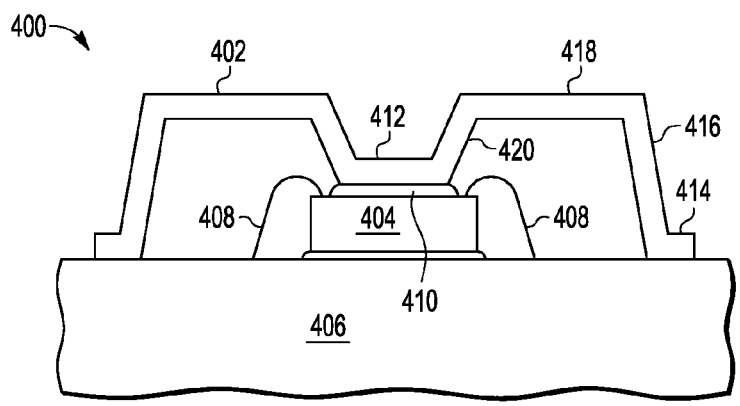
FIG. 5 is side cross-sectional view along a major axis of the encapsulant exclusion region of the packaged semiconductor device of FIG. 2.

Embodiments of devices and methods are disclosed that provide packaged semiconductor devices with encapsulant exclusion regions that are shaped to help prevent voids in the encapsulant from forming in the encapsulant. The encapsulant exclusion regions can be shaped as an oval, ellipse, or other shape that promotes flow of the encapsulant around the entire perimeter of the encapsulant exclusion region. In alternate embodiments, the encapsulant exclusion region can include an opening or channel that allows encapsulant to flow from a leading portion to a trailing portion of the encapsulant exclusion region along the direction of flow of the encapsulant. The flow through the channel helps fill in the area around the trailing portion of the encapsulant exclusion region where voids were previously found to form.

FIG. 1 is a top view of a packaged semiconductor device 100 known in the prior art with a void 110 forming as the mold encapsulant 108 is injected onto package substrate 102 and fills in around encapsulant exclusion region 104 with a square shape. Encapsulant exclusion region can be created by a pedestal or post in an encapsulant mold (not shown) or by a downset portion of a heat spreader (not shown). The encapsulant 108 is injected into the mold (or between a heat spreader and the package substrate) through port 106. A trailing portion of encapsulant exclusion region 104 is a corner placed in a location where the encapsulant flows last. In some cases, the encapsulant flows around the sides of encapsulant exclusion region 104 and starts to come together at a point beyond the trailing portion of encapsulant exclusion region 104. Air can become trapped in an area 110 behind encapsulant exclusion region 104 as the connecting portions of the encapsulant fill in behind encapsulant exclusion region 104 and move toward the trailing portion of region 104.

FIG. 2 is a top view of an embodiment of a packaged semiconductor device 200 with an encapsulant exclusion region 202 with an oval or ellipse shape to reduce the potential for void areas in the encapsulant 108. FIG. 3 is a top view of encapsulant exclusion region 202 of FIG. 2 showing a minor axis 204 across the width of region 202 and a major axis 206 along the length of region 202. The length of major axis 206 is greater than the width of minor axis 204 and is the single longest distance of region 202. The width 208 of leading portion 210 and the width 212 of trailing portion 214 is less than the width of minor axis 204. In other embodiments, region 202 can be rounded at leading portion 210. The streamlined shape of region 202 promotes flow of encapsulant 108 around the entire periphery of region 202 including trailing portion 214.

In some embodiments, region 202 is oriented with the longest distance of region 202 aligned within 30 degrees with respect to the line connecting port 106 and region 202 to promote flow of encapsulant 108 around the entire periphery of region 202 before the flow converges at a point behind trailing portion 214. Region 202 can be oriented so that the distance between the periphery of region 202 along the longest dimension of region 202 and port 106 is as short as possible. For example, the encapsulant exclusion region 202 has a first length or major axis 206 corresponding to a single longest distance across the encapsulant exclusion region 202. The major axis 206 can be aligned, within 30 degrees, to a line defined by a shortest distance between an entry point of the injection port 106 into the mold cavity and an outer perimeter 216 of the encapsulant exclusion region 202.

The relation of the dimension of minor axis 204 to the dimension of major axis 206 can be selected to maximize the size of encapsulant exclusion region 202 in order to maximize heat transfer from the die. The dimensions of minor axis 204 and major axis 206 can additionally be selected to promote the flow of encapsulant around the entire periphery of region 202 without forming voids in the encapsulant.

Referring to FIGS. 2 and 4, FIG. 4 is side cross-sectional view along minor axis 204 of the encapsulant exclusion region 202 of the packaged semiconductor device 200 of FIG. 2. Device 400 includes a heat spreader 402 mounted over integrated circuit die 404 to conduct heat from die 404. Die 404 and heat spreader 402 are mounted on package substrate 406. The package substrate 406 can be any epoxy laminate, FR-4, FR-5, BT, polyimide, or other suitable material. In some embodiments, the die can be attached to a leadframe (not shown) instead of substrate 406. Wirebonds 408 are formed between bond pads on the top surface of die 404 and electrical contacts (not shown) on substrate 406. The electrical contacts can be connected to vias through the dielectric layers to additional metal layers (not shown) and solder balls (not shown). An array of electrically conductive bumps (e.g., a ball grid array) (not shown) can be formed on the bottom surface of package substrate 406. Thermal interface material 410 can be deposited between the top surface of die 404 and downset portion 412 of heat spreader 402 so that die 404 is in thermal contact with heat spreader 402.

The width of the cross-section of downset portion 412 shown in FIG. 4 corresponds to the dimension of minor axis 204. Downset portion 412 can be in the center of heat spreader 402. Heat spreader 402 includes footer 414 around the bottom portion of the periphery of heat spreader 402. Footer 414 can be used to connect heat spreader 402 to substrate 406. Heat spreader 402 can include outer leg portion 416 between footer 414 and a top surface 418 of heat spreader 402. Outer leg portion 416 forms a sidewall around the periphery of heat spreader 402. Top surface 418 is connected between outer legs 416 and inner legs 420. Inner legs 420 are connected between top surface 418 and downset portion 412. Inner legs 420 are shorter than outer legs 416 to leave space between substrate 406 and downset portion 412 for die 404. In some embodiments, downset portion 412 can be filled in with thermally conductive material to form a top surface 418 across the top of heat spreader 402.

Referring to FIGS. 2 and 5, FIG. 5 is side cross-sectional view along major axis 206 of the encapsulant exclusion region 202 of the packaged semiconductor device 200 of FIG. 2. Note that the dimensions of the portion of downset portion 412 facing die 404 define encapsulant exclusion region 202 since encapsulant will be prevented from flowing over the top of die 404 by downset portion 412. In FIG. 5, the cross-section of downset portion 412 is longer than the cross-section of downset portion 412 shown in FIG. 4.

In embodiments where heat spreader 402 is not attached to device 400 before encapsulant 108 is molded around the die assembly, encapsulant exclusion region 202 can be formed using a pedestal or peg adjacent the top surface of the die 404 in a film assisted mold fixture. The cross-section of the pedestal or peg can have an oval, elliptical, or other suitable shape that promotes the flow of encapsulant around the peg or pedestal without forming voids in the encapsulant.

Figures 6, 7:
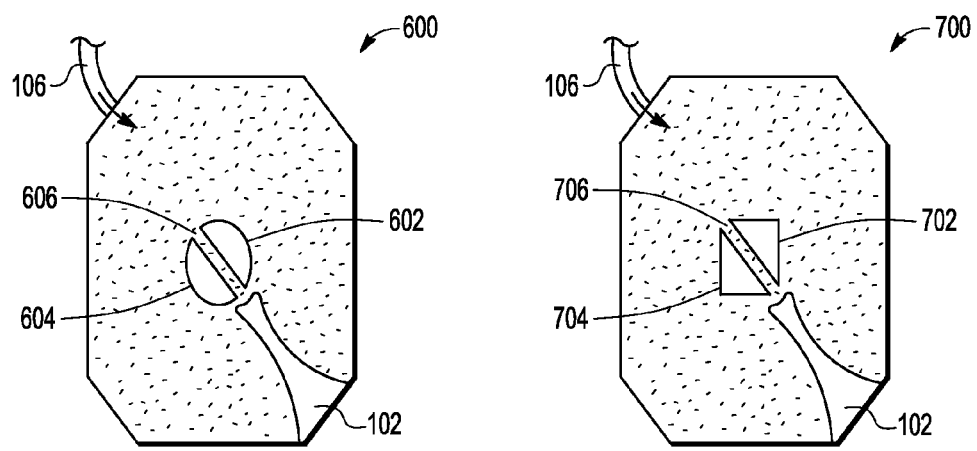
FIG. 6 is a top view of another embodiment of a packaged semiconductor device with an encapsulant exclusion region shaped to reduce the potential for void areas in the encapsulant.
FIG. 7 is a top view of another embodiment of a packaged semiconductor device with an encapsulant exclusion region shaped to reduce the potential for void areas in the encapsulant.

FIG. 6 is a top view of another embodiment of a packaged semiconductor device 600 with an encapsulant exclusion region shaped to reduce the potential for void areas in the encapsulant 108. The encapsulant exclusion region is formed with a channel or opening 606 between a flat surface of semicircular portions 602, 604. Even though a circular shape may not be ideal for promoting the flow of encapsulant without forming voids, channel 606 between semicircular portions 602, 604 allows encapsulant to fill in at a trailing edge of portions 602, 604 as the encapsulant is flowing around the sides of portions 602, 604. The encapsulant flowing around the sides and through the channel 606 is more likely to converge without forming voids than instances where a circular shape without a channel 606 is used for the encapsulant exclusion region.

FIG. 7 is a top view of another embodiment of a packaged semiconductor device 700 with an encapsulant exclusion region shaped to reduce the potential for void areas in the encapsulant. The encapsulant exclusion region is formed with a channel or opening 706 between facing side portions of triangles 702, 704. Note that a square shape is not ideal for promoting the flow of encapsulant without forming voids. Using a channel 706 between triangular portions 702, 704 allows encapsulant to fill in at a trailing edge of portions 702, 704 as the encapsulant is flowing around the sides of portions 702, 704. The encapsulant flowing around the sides and through the channel 706 is more likely to converge without forming voids than instances where a square shape without a channel 706 is used for the encapsulant exclusion region.

By now it should be appreciated that, in some embodiments, there has been provided a method for forming a packaged semiconductor device that can include placing a semiconductor die attached to a carrier into a mold cavity having an injection port. The semiconductor die has an encapsulant exclusion region on a top surface of the semiconductor die within an outer perimeter of the top surface. An encapsulant is flowed over the semiconductor die and carrier from the injection port. The encapsulant flows around the encapsulant exclusion region to surround the encapsulant exclusion region without covering the encapsulant exclusion region. The encapsulant exclusion region has a first length corresponding to a single longest distance across the encapsulant exclusion region. The first length is aligned, within 30 degrees, to a line defined by a shortest distance between an entry point of the injection port into the mold cavity and an outer perimeter of the encapsulant exclusion region.

In another aspect, the first length is further characterized as a major axis of the encapsulant exclusion region.

In another aspect, the encapsulant exclusion region has a leading portion having a first width measured parallel to a minor axis of the encapsulant exclusion region and a non-leading portion having a second width measured parallel to the minor axis that is greater than the first width. The non-leading portion is mutually exclusive with the leading portion.

In another aspect, the encapsulant exclusion region is further characterized as an ellipse.

In another aspect, no other distance across the region is as long as the first length.

In another aspect, the encapsulant exclusion region is symmetrical about the first length.

In another aspect, the encapsulant exclusion region is non-symmetrical about the first length.

In another aspect, the encapsulant exclusion region is defined by a portion of the mold cavity which contacts the semiconductor die during the step of flowing the encapsulant.

In another aspect, the portion of the mold cavity comprises a molding film which contacts the semiconductor die during the step of flowing the encapsulant.

In another aspect, the method can further comprise attaching a downset portion of a heat spreader to the encapsulant exclusion region after encapsulation of the packaged semiconductor device.

In another aspect, the step of placing the semiconductor die attached to the carrier into the mold cavity is further characterized in that the semiconductor die has a second encapsulant exclusion region on the top surface within the outer perimeter of the top surface. The second encapsulant exclusion region is mutually exclusive of the encapsulant exclusion region.

In another aspect, during the flowing, the encapsulant does not cover the second encapsulant exclusion region, wherein the second encapsulant exclusion region has a second length corresponding to a single longest distance across the second encapsulant exclusion region. The second length is aligned, within 30 degrees, to a line defined by a shortest distance between an entry point of the injection port into the mold cavity and an outer perimeter of the second encapsulant exclusion region.

In another aspect, after the flowing, the encapsulant between the encapsulant exclusion region and the second encapsulant exclusion region is aligned within 30 degrees with each of the shortest distance between the entry point of the injection port into the mold cavity and the outer perimeter of the encapsulant exclusion region and the shortest distance between the entry point of the injection port into the mold cavity and the outer perimeter of the second encapsulant exclusion region.

In other embodiments, a method for forming a packaged semiconductor device can comprise attaching a downset portion of a heat spreader to a top surface of a semiconductor die with a thermal interface material, wherein the semiconductor die is attached to a carrier. The downset portion of the heat spreader attached to the surface of the semiconductor die defines an encapsulant exclusion region on the top surface of the semiconductor die. The heat spreader, semiconductor die, and carrier are placed into a mold cavity having an injection port. An encapsulant is flowed over the semiconductor die and carrier from the injection port to surround the downset portion of the heat spreader and cover exposed portions of the semiconductor die and at least a portion of the carrier. The encapsulant exclusion region has a first length corresponding to a single longest distance across the encapsulant exclusion region. The first length is aligned, within 30 degrees, to a line defined by a shortest distance between an entry point of the injection port into the mold cavity and an outer perimeter of the encapsulant exclusion region. The packaged semiconductor device is devoid of encapsulant between the downset portion of the heat spreader and the top surface of the semiconductor die.

In another aspect, the first length is further characterized as a major axis of the encapsulant exclusion region.

In another aspect, the encapsulant exclusion region has a leading portion having a first width measured parallel to a minor axis of the encapsulant exclusion region and a non-leading portion having a second width measured parallel to the minor axis that is greater than the first width. The non-leading portion is mutually exclusive with the leading portion.

In another aspect, the encapsulant exclusion region is further characterized as an ellipse.

In another aspect, no other distance across the region is as long as the first length.

In still other embodiments, a packaged semiconductor device can comprise a die carrier, a semiconductor die attached to the die carrier, and a heat spreader having a downset portion attached to a top surface of the semiconductor die. The downset portion can have a bottom surface facing the top surface of the semiconductor die and be located within an outer perimeter of the top surface of the semiconductor die. An encapsulant is over the semiconductor die and the carrier and surrounding the downset portion of the heat spreader. The packaged semiconductor device includes an area devoid of encapsulant between the bottom surface of the downset portion and the top surface of the semiconductor die. The bottom surface of the downset portion has a first length corresponding to a single longest distance across the bottom surface of the downset portion. The first length is aligned, within 30 degrees, to a diagonal axis of the packaged semiconductor device.

In another aspect, the first length can be further characterized as a major axis of the bottom surface of the downset portion, and the bottom surface of the downset portion can have a leading portion having a first width measured parallel to a minor axis of the area devoid of encapsulant and a non-leading portion having a second width measured parallel to the minor axis that is greater than the first width. The non-leading portion is mutually exclusive with the leading portion.

In another aspect, the bottom surface of the downset portion can be symmetrical about the first length.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a packaged semiconductor device, the method comprising:
   placing a semiconductor die attached to a carrier into a mold cavity having an injection port, wherein the semiconductor die has an encapsulant exclusion region on a top surface of the semiconductor die within an outer perimeter of the top surface; and
   flowing an encapsulant over the semiconductor die and carrier from the injection port, wherein the encapsulant flows around the encapsulant exclusion region to surround the encapsulant exclusion region without covering the encapsulant exclusion region, wherein the encapsulant exclusion region has a first length corresponding to a single longest distance across the encapsulant exclusion region, wherein the first length is aligned, within 30 degrees, to a line defined by a shortest distance between an entry point of the injection port into the mold cavity and an outer perimeter of the encapsulant exclusion region.

2. The method of claim 1, wherein the first length is further characterized as a major axis of the encapsulant exclusion region.

3. The method of claim 2, wherein the encapsulant exclusion region has a leading portion having a first width measured parallel to a minor axis of the encapsulant exclusion region and a non-leading portion having a second width measured parallel to the minor axis that is greater than the first width, wherein the non-leading portion is mutually exclusive with the leading portion.

4. The method of claim 2 wherein the encapsulant exclusion region is further characterized as an ellipse.

5. The method of claim 1, wherein no other distance across the region is as long as the first length.

6. The method of claim 1, wherein the encapsulant exclusion region is symmetrical about the first length.

7. The method of claim 1, wherein the encapsulant exclusion region is non-symmetrical about the first length.

8. The method of claim 1, wherein the encapsulant exclusion region is defined by a portion of the mold cavity which contacts the semiconductor die during the step of flowing the encapsulant.

9. The method of claim 8, wherein the portion of the mold cavity comprises a molding film which contacts the semiconductor die during the step of flowing the encapsulant.

10. The method of claim 8, further comprising:
    after encapsulation of the packaged semiconductor device, attaching a downset portion of a heat spreader to the encapsulant exclusion region.

11. The method of claim 1, wherein the step of placing the semiconductor die attached to the carrier into the mold cavity is further characterized in that the semiconductor die has a second encapsulant exclusion region on the top surface within the outer perimeter of the top surface, wherein the second encapsulant exclusion region is mutually exclusive of the encapsulant exclusion region.

12. The method of claim 11, wherein, during the flowing, the encapsulant does not cover the second encapsulant exclusion region, wherein the second encapsulant exclusion region has a second length corresponding to a single longest distance across the second encapsulant exclusion region, wherein the second length is aligned, within 30 degrees, to a line defined by a shortest distance between an entry point of the injection port into the mold cavity and an outer perimeter of the second encapsulant exclusion region.

13. The method of claim 12, wherein, after the flowing, the encapsulant between the encapsulant exclusion region and the second encapsulant exclusion region is aligned within 30 degrees with each of the shortest distance between the entry point of the injection port into the mold cavity and the outer perimeter of the encapsulant exclusion region and the shortest distance between the entry point of the injection port into the mold cavity and the outer perimeter of the second encapsulant exclusion region.

14. A method for forming a packaged semiconductor device, the method comprising:
    attaching a downset portion of a heat spreader to a top surface of a semiconductor die with a thermal interface material, wherein the semiconductor die is attached to a carrier, and wherein the downset portion of the heat spreader attached to the surface of the semiconductor die defines an encapsulant exclusion region on the top surface of the semiconductor die;
    placing the heat spreader, semiconductor die, and carrier into a mold cavity having an injection port; and
    flowing an encapsulant over the semiconductor die and carrier from the injection port to surround the downset portion of the heat spreader and cover exposed portions of the semiconductor die and at least a portion of the carrier, wherein the encapsulant exclusion region has a first length corresponding to a single longest distance across the encapsulant exclusion region, wherein the first length is aligned, within 30 degrees, to a line defined by a shortest distance between an entry point of the injection port into the mold cavity and an outer perimeter of the encapsulant exclusion region, and wherein the packaged semiconductor device is devoid of encapsulant between the downset portion of the heat spreader and the top surface of the semiconductor die.

15. The method of claim 14, wherein the first length is further characterized as a major axis of the encapsulant exclusion region.

16. The method of claim 15, wherein the encapsulant exclusion region has a leading portion having a first width measured parallel to a minor axis of the encapsulant exclusion region and a non-leading portion having a second width measured parallel to the minor axis that is greater than the first width, wherein the non-leading portion is mutually exclusive with the leading portion.

17. The method of claim 15 wherein the encapsulant exclusion region is further characterized as an ellipse.

18. The method of claim 14, wherein no other distance across the region is as long as the first length.

19. A packaged semiconductor device, comprising:
    a die carrier;
    a semiconductor die attached to the die carrier;
    a heat spreader having a downset portion attached to a top surface of the semiconductor die, wherein the downset portion has a bottom surface facing the top surface of the semiconductor die and is located within an outer perimeter of the top surface of the semiconductor die; and
    an encapsulant over the semiconductor die and the carrier and surrounding the downset portion of the heat spreader, wherein the packaged semiconductor device includes an area devoid of encapsulant between the bottom surface of the downset portion and the top surface of the semiconductor die, wherein the bottom surface of the downset portion has a first length corresponding to a single longest distance across the bottom surface of the downset portion, and wherein the first length is aligned, within 30 degrees, to a diagonal axis of the packaged semiconductor device.

20. The packaged semiconductor device of claim 19, wherein the first length is further characterized as a major axis of the bottom surface of the downset portion, and wherein the bottom surface of the downset portion has a leading portion having a first width measured parallel to a minor axis of the area devoid of encapsulant and a non-leading portion having a second width measured parallel to the minor axis that is greater than the first width, wherein the non-leading portion is mutually exclusive with the leading portion.

21. The packaged semiconductor device of claim 19 wherein the bottom surface of the downset portion is symmetrical about the first length.

* * * * *